United States Patent [19]
Diehlmann et al.

[11] Patent Number: 5,831,214
[45] Date of Patent: Nov. 3, 1998

[54] ELECTRICAL CIRCUIT

[75] Inventors: Ralf Diehlmann, Bretten-Gölshausen; Volker Block, Bretten, both of Germany

[73] Assignee: E.G.O. Elektro-Geratebau GmbH, Oberderdingen, Germany

[21] Appl. No.: 744,226

[22] Filed: Nov. 5, 1996

[30] Foreign Application Priority Data

Nov. 10, 1995 [DE] Germany .................. 195 41 976.6

[51] Int. Cl.⁶ .................................................. H01R 4/00
[52] U.S. Cl. ........................................ 174/94 R; 174/261
[58] Field of Search .................. 174/94 R, 250, 174/260, 261, 52.2; 219/56.1, 56.21; 228/4.5

[56] References Cited

U.S. PATENT DOCUMENTS

| | | | |
|---|---|---|---|
| 3,791,028 | 2/1974 | Missel | 29/628 |
| 4,569,876 | 2/1986 | Nakakita | 428/131 |
| 4,908,935 | 3/1990 | Blumenstock | 174/52.2 X |
| 4,935,581 | 6/1990 | Komatha | 174/52.2 X |
| 4,978,814 | 12/1990 | Honour | 174/130 R |
| 5,028,454 | 7/1991 | Lytle et al. | 427/123 |
| 5,139,192 | 8/1992 | Simmonds | 174/94 R X |
| 5,310,965 | 5/1994 | Senba et al. | 174/250 |
| 5,313,365 | 5/1994 | Pennisi et al. | 174/52.2 X |
| 5,442,145 | 8/1995 | Imai et al. | 174/260 X |
| 5,486,653 | 1/1996 | Dohi | 174/94 R X |
| 5,547,530 | 8/1996 | Nakamura et al. | 156/89 |

FOREIGN PATENT DOCUMENTS

| | | |
|---|---|---|
| 3 67 672 | 7/1982 | Austria . |
| 21 61 023 B2 | 12/1980 | Germany . |
| 82 03 769.8 | 6/1982 | Germany . |
| 37 00 257 A1 | 7/1988 | Germany . |
| 90 01 070.1 | 7/1991 | Germany . |
| 91 11 858.1 | 2/1992 | Germany . |
| 37 19 083 C2 | 4/1994 | Germany . |
| 41 28 908 C2 | 4/1994 | Germany . |
| 44 28 808 A1 | 2/1996 | Germany . |
| 44 40 189 A1 | 9/1996 | Germany . |
| 54-114790 | 9/1979 | Japan . |
| 2-106092 | 4/1990 | Japan . |
| 4-118985 | 4/1992 | Japan . |
| 5-77064 | 3/1993 | Japan . |
| 07057790 A | 3/1995 | Japan . |
| 07006938 A | 10/1995 | Japan . |
| 07096378 A | 11/1996 | Japan . |
| 719834 | 3/1980 | U.S.S.R. .................. 228/4.5 X |

OTHER PUBLICATIONS

German Search Report in DE 195 41 976.6 dated 22 Jul. 1996.

*Primary Examiner*—Dean A. Reichard
*Attorney, Agent, or Firm*—Quarles & Brady

[57] ABSTRACT

A circuit (1) includes a plate-shaped substrate (2), a thick-film conductor array (8) having first contact parts (11), with which second contact parts (13) of connecting leads (15) are connected two-dimensionally by a compression bond. The second contact parts (13) are configured tape-like by compression from a copper strand. An additional, non-conducting positional seal (30) of a potting compound (31) positively locates the connecting leads (15) in position with respect to the substrate (2), as a result of which very high currents can be handled at very high operating temperatures by simple means.

23 Claims, 1 Drawing Sheet

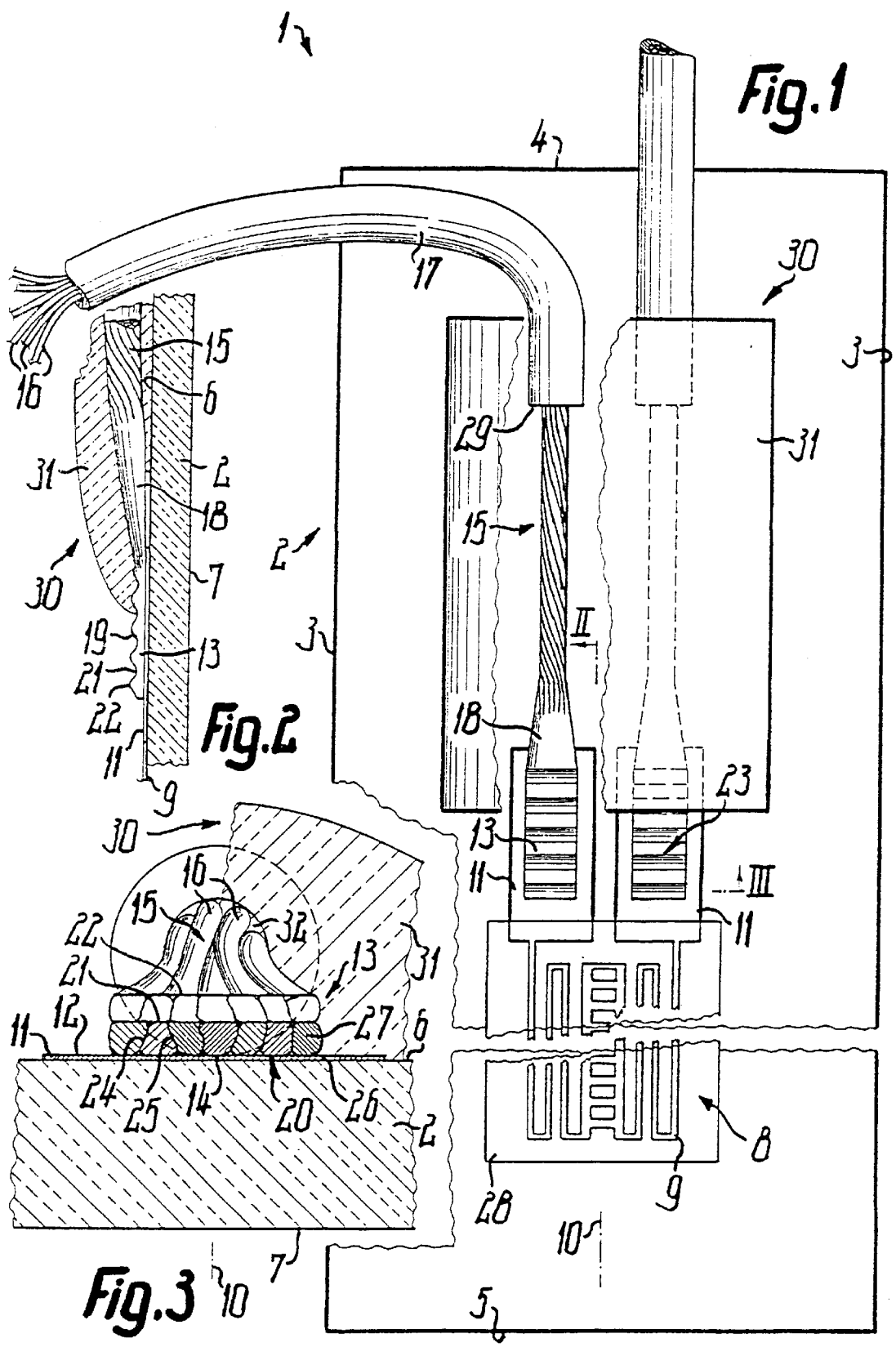

ELECTRICAL CIRCUIT

TECHNICAL FIELD AND BACKGROUND OF THE INVENTION

The invention relates to an electrical circuit, particularly a thick-film circuit preassembled as a package, comprising a dimensionally rigid substrate, on at least one side or surface of the substrate, an electrical circuit arranged firmly located and connecting leads firmly connected to the latter and to the substrate, which e.g. as flexible connecting wires or cables stand off freely accessible and bendable at will from the substrate for connecting the circuit to an instrument control.

The circuit may include an electrical resistor, e.g. in the form of a sensor, a control heater or the like and is expediently partly or totally formed by a thick-film conducting path. The conducting path is applied to an electrically insulating surface of the substrate by a paste containing binding agents as a screen print and then hardened by firing or sintering as a thin layer of less than a tenth or a hundredth of millimeter thick. As compared thereto, ends of the conducting path form contact parts widened, or more than ten times as large in conductive cross-section which likewise executed as a thick-film belong to the conducting path and may likewise be located spaced away from one up to all of the outer edges of the substrate within the circuit surface belonging thereto.

At the contact area of the respective contact part parallel to the circuit surface a contact part of the connecting lead is secured via a contact terminal and this contact part is expediently configured integral throughout with a longitudinal section of the connecting lead which may stand off far away from the substrate. This second contact part of the connecting lead comprises relative to the conductor array a conductive cross-section which is many times greater, which e.g. with respect to the maximum or minimum conductive cross-section of the conducting path may be at least two, three or four hundred times larger and with respect to the corresponding conductive cross-section of the connecting lead is at least ten or fifteen times larger, i.e. in the region of the contact areas to be interconnected.

These contact areas are connected by microbonding which may include a connection made by welding, soldering, bonding or the like. Preferably, a bond is provided in such a form that a connecting layer encompassing the contact areas creates by solid-state diffusion an intermetallic phase from the materials of both contact parts, the concentration of the material of the respective contact part increasing in the direction thereof. This connection may be produced by pressure applied transversely to the contact areas, by relative movements between the contact areas and/or by applying heat, namely e.g. by ultrasonic, thermocompression and/or thermosonic bonding. In the case of ultrasonic bonding the oscillation vector lies parallel to the contact areas, as a result of which the relative movements are generated therebetween. In the case of thermocompression bonding the connection is produced under the effect of pressure and heat with simultaneous plastic deformation of the contact part of the connecting lead. In the case of thermosonic bonding the connection is generated under the effect of pressure, heat and ultrasonic energy, the oscillation vector in this case being transverse to the contact areas.

In these compression bonding techniques the connection is produced by bonding since the metal lattices of the two contact areas are approximated to lattice spacing, at least one of the contact areas being plastically deformed and for this purpose their ductility increased by the application of heat and/or ultrasonic energy since these result in a softening and better flow of the material similar to that in cold shaping. Any oxide coatings existing are to be removed to improve the cold weld. The conducting path or the corresponding contact part formed by metallization may also be applied to the substrate by roll plating, electroplating or the like.

For conducting higher currents or power currents there is the problem in conjunction with such contacts that they may exhibit relatively high contact resistance, may be capable of handling only low currents and that their strength is reduced under high operating temperatures until the contact areas cancel each other out so that the miniaturized package loses its function after a short time in operation. If contact is made by contacts which can be lifted off from each other and pressed against each other. These disadvantages may be reduced somewhat, but such a configuration is very costly and bulky.

OBJECTS OF THE INVENTION

The invention is based on the object of avoiding the disadvantages of known configurations or as described and, in particular, to define a contact which is resistant to operating temperatures above the melting points or melting ranges of soft solders, which has a high temperature cycling resistance, features high mechanical stability, forms a low contact resistance, permits handling of high currents and/or is conducive to low-cost large series production.

SUMMARY OF THE INVENTION

According to the invention means are provided to boost the working or operating temperature of the contact to at least 300°, 350° or 450° C. without it becoming damaged. Expediently the contact is thereby resistant to ambient temperature cycles up to at least 320° C., as a result of which the circuit may be arranged e.g. in the heating region of a heating appliance, such as a cooking point heater and for instance in the case of an induction heater exposed to the heating energy thereof so that it is suitable as a sensor for this heating.

The second contact area of the connecting lead or the intermetallic phase contains to advantage copper, the second contact part consisting partly or fully of copper and its surface silver-plated, where necessary. The contact area of the conductor array contains expediently silver or palladium, whereby it may consist totally of silver or a silver/palladium alloy, as a result of which the intermetallic phase also contains silver.

The second contact part forms expediently a flat ribbon or chain which may be many times thicker with respect to the first contact part, at least twenty or fourty times thicker than the first contact part and expediently below one millimeter and above one or two tenths of a millimeter in thickness. Expediently, this contact part features, particularly in its longitudinal direction, alternatingly different thicknesses e.g. by its flat surface facing away from the first contact area being corrugated in cross-section or over its full width throughout due to the plastic deformation in making the connection. In the valleys of the corrugation this results in increased pressure loading so that here the strength of the bond is particularly high and several such regions located spaced away from each other are formed juxtaposed.

Although the second contact part could be integral throughout in cross-section, expediently, however, it is made up of from at least two to at least five separate parts which may have the same conductor cross-sections. These parts may for example be formed by roughly seven individual wires of a strand and twisted one on the other and/or located parallel to each other, the sum of the cross-sections of the individual wires forming the cross-section of the connecting lead of e.g. less than 5 or 3 mm of the contact part and of the connecting lead.

The separate component wires of the connecting lead touch each other throughout by their circumferential surfaces over the length of the contact part or over the second contact area and are shaped cross-sectionally to each other by the plastic deformation so that they come into contact with each other not only practically continuously, but are also conductively connected to each other by their surfaces substantially throughout also in transverse spacing from the contact by the cited microbonding. As a result of this the maximum thickness of the second contact part may be approximately the same as, or greater than, the diameter of the individual wires by a factor of two, three or four times the diameter.

Irrespective of the described configuration it is expedient to provide, in addition to the contact, which with respect to the conductor array and the substrate has a substantially smaller surface extension, a seal for positively sealing by force or dimension the location of the second contact part, the longitudinal section of the connecting lead adjoining the latter or the contact areas and/or an insulation surrounding the connecting lead in the shape of a tube or sleeving, all with respect to the substrate, and/or to substantially cover or tightly surround at least one of these regions or the first contact area, but not the conductor array on the side facing away from the substrate.

This positioning seal too, may also be configured as a kind of microbond or bonded connection, it consisting substantially of an electrically insulating material throughout and is preferably secured by bonding to one of the stated regions or to the corresponding surface of the substrate. The positional seal may also engage between the individual wires of the connecting lead spaced away from the second contact part or form a connecting layer between the latter and the insulation of the corresponding surface of the substrate, the thickness of which is smaller than that of the substrate or of the diameter of the connecting lead. As a result of this and after microbonding the connecting lead can be embedded in an insulating compound substantially continuously and inaccessible from without. Due to the positional seal and after contacting the connecting lead can be neither lifted off from the substrate nor shifted in position in its longitudinal direction with respect thereto by being tugged.

The substrate may be formed partly or completely by a ceramic substrate. It may, however, also consist of metal and be provided on the circuit surface with an insulating layer on which the circuit is arranged. The configuration according to the invention is suitable in particular for very small circuits, the substrate of which has a surface area of less than 50, 30 or 10 cm and a thickness of less than 5, 3 or 1 mm. The contact is capable of handling current loads of more than 1 Ampere and can be employed at operating temperatures of up to approximately 500° C.

These and further features are evident not only from the claims but also from the description and the drawings, each of the individual features being achieved by themselves or severally in the form of subcombinations in one embodiment of the invention and in other fields and may represent advantageous aspects as well as being patentable in their own right, for which protection is sought in the present.

BRIEF DESCRIPTION OF THE DRAWINGS

An example embodiment of the invention is explained in more detail in the following and illustrated in the drawings in which:

FIG. 1 is a view of the circuit in accordance with the invention represented substantially magnified;

FIG. 2 is a section view of the circuit in cross-section along the line II of FIG. 1, and FIG. 3 is a section view of the circuit in cross-section along the line III of FIG. 1, again represented further magnified.

DETAILED DESCRIPTION OF THE DRAWINGS

The package or circuit 1 comprises as the substrate body a non-flexible substrate 2 which is plate-shaped, integral throughout and, where necessary, multilayer as well as vitrious which mounts all of the remaining components or elements of the circuit 1. The elongated rectangular glass ceramic substrate 2 cut from a larger ceramic slab has outermost edge surfaces which are straight throughout, namely two parallel longitudinal edges 3 and two transverse edges 4, 5 connecting the latter transversely or at right angles. Each of the outermost plate surfaces 6, 7 defined by these edges 3 to 5 is flat throughout and like the substrate free of penetrations.

On one surface 6 only an elongated array of conductors 8 is provided parallel to the longitudinal direction of the substrate 2 spaced away from each edge 3 to 5, this spacing being at least as wide as the width of the conductor array 8 or wider with respect thereto. The conductor array 8 consists exclusively of a metallization formed by a paste coating of the surface 6 and forms a conducting path less than one or half a millimeter thick, the longitudinal sections of which are provided parallel to the longitudinal direction of the array 8 with spaces inbetween which are, at the most, twice or three times as large as the width of the longitudinal sections. The longitudinal sections are interconnected at their ends alternatingly meander-shaped via cross-sections of the conducting path 9. The side outermost longitudinal sections adjoin at the same end of the array 8 first contact parts 11 which are configured like the conducting path 9 and secured to the area 6 and have the same layer thickness as the conducting path 9. Each of the contact parts 11 elongated parallel to the array 9 is at least ten-times wider than the conducting path 9, has roughly the same spacing as the latter from the adjacent edge 3 in each case and a spacing inbetween which is many times smaller with respect to the width thereof. The surface of each contact part 11 facing away from the area 6 and flat throughout, forms a first contact area 12.

Secured to each contact area 12 is a second contact part 13 in the form of a tape-like or plate-like pad having likewise a second contact area 14 flat throughout, which can only be released destructively and which is formed by the end of a connecting lead 15 configured integrally therewith. The connecting lead 15 is a wire strand made up of seven individual wires 16 which is surrounded by an axially symmetrical electrical insulation preassembled spaced away from the pad 13, whereby in parting a longitudinal section of this insulation, the pad 13 and an adjoining section of the lead 15 are exposed only in the region in which they lie within the edges 3 to 5 as shown in the view of FIG. 1. The insulating sleeve 17 is intregral full-length continuously, fully surrounding the circumference of the lead 15. Outside thereof as well as in the region of the insulating sleeve 17 or in common therewith the lead 15 is so flexible that it can manually be bent in all directions, it then retaining the bend by its own rigidity.

The spacing of an upper edge of the array 8 from the substrate edge 4 bordering the contact parts 11 is greater, for example at least two or three times greater than the spacing of the lower edge of the array 8 from the substrate edge 5. As a result of this, between the array 8 and the substrate edge 5 a window in the surface 6 free of any conductor array also bordered by the edges 3 is formed in which the leads 15 can be sealed in position once or multiply with respect to the substrate 2. Substantially all of the described arrays and configurations are positioned symmetrical to a longitudinal center plane 10 of the substrate 2 or of the circuit 1 located between the edges 3. However, the lead 15 may be angled such that, in viewing the surface 6, it does not cross the edge 4, but only one of the edges 3.

Both pads 13 are configured the same. The pad which in the section view is elongated rectangular translates via a stem 18 into the otherwise cylindrically defined lead 15. This stem 18 is s viewed in FIG. 1 tapered from the width of the pad 13 continuously to the diameter of the lead 15 and in the side view of FIG. 2 it is flared from the thickness of the pad 13 continously to said diameter, so that smooth transitions in the round cross-section of the lead 15 materialize from the flat cross-section of the pad 13 which is wider and thinner with respect to the diameter of the connecting lead 15 over a length which is in the order of magnitude of the length of the pad 13. The surface 19 of the pad 13 facing away from the contact part 11 is profiled by recesses or protrusions, whilst the surfaces of the stem 18 may be free of such profiling, i.e. smooth. The angle of taper and flare respectively of the stem 18 is acute.

The contact area 14 of the pad 13 is narrower and shorter than the contact area 12 and is located spaced away from both parallel longitudinal or the two transverse edges at right angles thereto of the contact part 11. The contact areas 12, 14 contacted to each other are mechanically locked in position by a contact 20, namely a compression bond which extends continuously over the contact area 14. The contact area 12 consists of silver or silver palladium and the contact area 14 consists of a continuous full-length silver plating of each of the individual wires 16, each of which is made of copper and totally surrounded by a micro-thin layer of silver. For bonding, the end of the lead 15 is received by its still round cross-section in a recess of a tool which together with the area 12 represents a complementary shape to the shape of the pad 13. By means of this tool the end of the lead is pressed against the area 12 transversely to its longitudinal direction and connected to the area 12 by means of ultrasonic and thermocompression bonding, simultaneously with the compressing force a plastic deformation of the round cross-section of the lead 15 being affected, translating the latter cross-section into the flat cross-section of the pad 13 and that of the stem 18.

In this action, also each of the individual wires 16 is plastically deformed from its initially circular round cross-section into a cross-section deviating therefrom, particularly such that juxtaposed circumferential and surface areas 24 of adjacent wires 16 are interformed complementary over the length of the pad 13, pressed strongly against each other correspondingly radially and connected to each other over a large area by microbonds 25 over the length of pad 13 and the area 14 respectively. Due to the ultrasonic energy and the friction between the areas 12, 14, wires 16 located juxtaposed parallel and/or transversely to their longitudinal direction or parallel and/or transversely to the areas 12, 14 may be thereby moved against each other so that due to the friction of the areas 24 on each other the cold welds 25 are affected. All wires 16, or the majority thereof, may form over the entire length of the pad 13 or partial sections thereof length sections of the area 14 associated directly therewith so that all wires 16 are located in a single plane in the cross-section of FIG. 3 and translate from area 14 to area 19.

The compression/bonding tool comprises a compression area profiled in accordance with one of the profiles of the area 19. Due to the profiling, alternately thinner and thicker sections of the pad 13 are formed, which expediently lie exclusively in sequence in the longitudinal direction thereof and continuously over its width. In the region of the thinner zones 21 a greater compression force materializes between the lines 16 and areas 14 than in the region of the thicker zones 22 where the compression force is correspondingly less, but which also results in bonding. The profile may be executed simply as a corrugation 23 the spacing between two neighboring, identical zones 21 and 22 respectively being many times smaller than the width of the pad 13 and many times larger than the smallest or greatest thickness thereof.

Directly adjoining the last zone 21 and 22 respectively and still in the region of the area 12 is the stem 18 which is not secured to the area 12, it instead permitting lifting off therefrom and from the area 6 together with the adjoining longitudinal section of the lead 15 by bending. The stem 18 is likewise formed by the compression force in bonding as described and over part of their length adjoining the pad 13 the wires 16 are likewise bonded to each other in the way as described. Adjoining thereto and in the region of the remaining lead 15 the wires remain unbonded and movable with respect to each other.

The entire conductive cross-section 27 of the pad 13 which equals that of the stem 18 and of the remaining lead 15, amounts in this case to 0.22 mm$^2$ and is with respect to the conductive cross-section 26 of the contact part 33 defined by the width of the area 14 at least ten or twenty times greater. The cross-sectional width of the pad 13 is at least two or four times greater than its minimum or maximum thickness, the zones 21, 22 extending transversely to the longitudinal direction of the wires 16. With respect to the cross-section of conducting path 9 the conductive cross-sections 27 are greater by at least two hundred times.

The conductor array 8 or the complete conducting path 9 and only the partial sections of the contact parts 11 adjoining the latter, but not the areas occupied by the pads 13 or the areas 14, are covered by a thin transparent coating 28 of a transparent, electrically conductive resist or the like, which in the view shown in FIG. 1 extends beyond the conductor array 8 on all sides and is bonded full-surface between the sections of the conducting path to the surface area 6 as well as being connected to the surface area of the entire conducting path 9 facing away from the latter. The coating 28 is spaced away from all edges 3 to 5.

Each connection 20, every stem 18, each section of the connecting lead 15 adjoining the latter and the corresponding end of the insulation 17 is individually and additionally sealed in place by a common seal 30 directly with respect to the substrate 2 and the area 6 respectively, the seal 30 engaging exclusively the area 6 and not the areas 3 to 5 and 7. A common seal 30 or a common or integral positioning member may be provided for both adjacent terminals or leads 15, leading away from the pads 13 spaced away from each other in parallel. The seal 30 is expediently connected to the areas 6, 12, 19 by bonding, i.e. both on the sides of the elements 11, 13, 18, 15, 17 facing away from each other and also therebetween, whereby the connection may also be made full length between the surface areas 12, 6 and the sides of the elements 18, 15, 17 facing the latter.

The seal 30 thus encapsulates the lead 15 and the end of the insulating sleeve 17 as well as part of the stem 18 and also adjoins the side edges of the pad 13 as well as the end area 29 of the insulating sleeve 17 so that the latter is safeguarded against being tugged away from the lead 15. Standing off from the sole conducting connection 20 are the stem 18 and the lead 15 within the seal 30 and up to the end thereof facing the edge 4 straight and parallel to the area 6 with no further metallic connection thereto.

The seal 30 consists expediently throughout of an insulant, particularly vitrified ceramic which is applied to the cited areas as a plastic potting compound or bond under pressure and molding and then hardened. The free end of each pad 13 then protrudes from the seal 30 so that the major part of the area 19 is exposed as a copper window, since the silver plating has been removed by the compression bonding. The compound 31 is able to also penetrate from the circumference of the lead 15 into the longitudinal gaps 32 between the wires 16, sealing them directly with respect to each other and thus sealing the wires 16 and their transition into the pad 13 or the stem 18 from tugging loads.

Due to the described configuration the circuit 1 or the substrate 2 is thermally stressed highly consistently, the seal 30 being thermally coupled intimately over a very large area via the stated areas. By closing the circuit via the free ends of the leads 15 the conductor array 8 becomes effective. The circuit 1 is particularly suitable for Platinum sensors such as temperature sensors at cooking points, the heating of which is transmitted by induction to the cooking utensil. The length of the substrate 2 is expediently at least two or three times greater than its width and the corresponding factor of the field of the conductor array 8 is, with respect thereto, greater by at least five or seven. The length of this field corresponds to only roughly half the substrate 2 and with respect to both lengths the length of the elongated seal 30 is substantially smaller. As, for instance, a temperature limiter or overheating protection the circuit may be arranged with the conductor array extending freely into the interior of a heating unit and retained merely on the sides of the leads 15 or of the seal 30, e.g. by spring clips clasping the edges 3, 4, by a hardened plastic adhesive, a potting compound or the like.

It will be appreciated that the explained properties may be provided for, precisely as described or merely approximately or substantially as described and may even greatly deviate therefrom.

We claim:

1. An electrical circuit comprising:
    a circuit base (2);
    a conductor array (8) at least partially including a conducting layer with at least one first connecting member (11); and
    at least one power connection (20) including a microbond between said at least one first connecting member and a second connecting member (11, 13), said at least one first connecting member (11) being directly supported by said circuit base (2) for electrically interconnecting with said conductor array (8), said second connecting member (13) being directly electrically connected to at least one power lead (15), said at least one first connecting member (11) including a first connecting face (12) and said second connecting member (13) including a second connecting face (14) directly connected to said first connecting face (12) via said microbond, said conductor array (8) defining a first conductive cross-section (26) including maximum and minimum first cross-sections (26), said second connecting member (13) defining a second conductive cross-section (27), wherein said second conductive cross-section (27) is larger than said first conductive cross-section (26), said second conductive cross-section (27) being plastically deformed by cold swaging while interconnecting said first and second connecting faces (12, 14) with said microbond.

2. The circuit according to claim 1, wherein apart from said microbond at least one of said connecting members (11, 13) contains copper, said second connecting member (13) being made in one part with said at least one power lead (15), said at least one power lead (15) including a flexibly deformable external lead section freely and bendably extending away from said circuit base (2).

3. The circuit according to claim 1, wherein apart from and additional to said microbond a positional lock (30) is provided for positionally securing said at least one power lead (15) directly with said circuit base (2), said at least one power lead (15) being an external lead including a lead section remote from said second connecting member (13), said lead section freely and accessibly projecting out of said positional lock (30).

4. The circuit according to claim 1, wherein at said second connecting face (14) said second conductive cross-section is flat when seen in transverse cross-section through said second connecting member (13).

5. The circuit according to claim 1, wherein at said second connecting face (14), said second connecting member (13) includes a plurality of individual conductor lines (16) including juxtaposed conductor lines (16), said juxtaposed conductor lines (16) being circumferentially directly interconnected with said microbond (25) at said second connecting face (14), at least one of said conductor lines (16) being cross-sectionally plastically deformed by said cold swaging.

6. The circuit according to claim 5, wherein at said second connecting face (14), said conduct lines (16) form a line layer defining a layer thickness, transverse to said second connecting face (14) each one of said individual conductor lines (16) defining a width extension substantially equal to said layer thickness, within said line layer said juxtaposed conductor lines (16) being deformingly compressed transverse to said second connecting face (14) to include irregular line cross-sections (27), in cross-section transverse to said connecting face (14) said line cross-sections (27) of said juxtaposed conductor lines (16) being in substantially full areal contact over said layer thickness.

7. The circuit according to claim 1, wherein said second connecting member (13) is comprised of copper, said second connecting member (13) being made in one part with said at least one power lead (15), said power lead (15) including an individual lead section freely and bendably extending away from said circuit base (2).

8. The circuit according to claim 1, wherein said power connection (20) contains silver, plated on said second connecting face (14) prior to deforming and fixing said second connecting member (13) with said microbond.

9. The circuit according to claim 1, wherein said microbond of said at least one power connection (20) includes at least one of
    a compression weld,
    an ultrasonic weld, and
    a thermosonic weld,
    including said cold swaging for flattening said second connecting member (13).

10. The circuit according to claim 1, wherein at said microbond, said second conductive cross-section (27) is areally at least two hundred times larger than said first conductive cross-section (26), said conductor array (8) including at least one of
    a resistor sensor, and
    a resistor heater.

11. The circuit according to claim 1, wherein said first connecting member (11) is arranged on said circuit base (2) as a compound layer made from a sintered paste, at least in the vicinity of said first connecting member (11) said circuit base (2) being made from an electrically insulating material, at a longitudinal distance from said second connecting member (13) said at least one power lead (15) being directly fixed to said circuit base (2).

12. The circuit according to claim 1, wherein said circuit base (2) includes a circuit surface (6) defining an overall circuit field smaller than said circuit surface (6), said circuit surface being directly connected to said conductor array (8) exclusively within said circuit field, said at least one first connecting member (11) comprising two separate individual and juxtaposed first connectors located exclusively within said circuit field, said circuit surface (6) being at least three times larger than said circuit field, said at least one power lead (15) extending substantially parallel to and away from said conductor array (8), said at least one power lead (15) covering said circuit surface (6).

13. The circuit according to claim 12, wherein said circuit surface (6) defines a center plane (10) oriented transverse to said circuit surface (6), said circuit field being arranged substantially symmetrical to said center plane (10), said conductor array (8) including only a single and continuous conductor path (9).

14. The circuit according to claim 12, wherein said circuit field is oblong parallel to a circuit length defined by said circuit array (8), said circuit surface (6) being parallel to a base length oriented substantially parallel to said circuit length, transverse to said circuit length, said circuit surface (6) defining a base width, said circuit field defining a field end including said first connectors (11), said circuit surface (6) extending over and beyond said field end by at least twice said base width.

15. The circuit according to claim 1, wherein said circuit base (2) is formed by a plate of substantially constant thickness over substantially entirely a circuit surface (6), said circuit surface (6) defining an areal extension of less than 30 cm$^2$, said conductor array (8) including a heating resistor.

16. The circuit according to claim 1, wherein said second conductive cross-section (27) is greater than 0.2 mm$^2$, said second conductive cross-section (27) being assembled from a plurality of individual cross-sections interconnected with said microbond, said individual cross-sections being substantially equal.

17. The circuit according to claim 1, wherein over at least part of a lead length, said at least one power lead (15) is enveloped by an electrically insulating sleeve (17) extending over an upper surface of said circuit base (2), said insulating sleeve (17) including a forward sleeve end (29) directly fixed to said circuit base (2) and made from an electrically insulating material.

18. The circuit according to claim 17, wherein said insulating sleeve (17) is longitudinally spaced from said second connecting face (14) by a sleeve spacing greater than a longitudinal bond extension of said microbond, said bond extension extending substantially parallel to said power lead, said conductor array (8) including a resistor sensor.

19. The circuit according to claim 3, wherein said positional lock (30) is made from a locking substance plastically formed against engagement faces of said circuit (1), said positional lock (30) including a rigidly hardened bonding and casting compound (31), said positional lock (30) including a ceramic compound, said casting compound (31) not covering most of said conductor array (8).

20. The circuit according to claim 1, wherein said at least one power connection (20) is dimensioned for permanently transmitting a current of at least half an Ampere, said at least one power connection (20) being dimensioned for conducting current at a permanent temperature of said at least one power connection (20) of more than 250° C., said conductor array (8) including a thermal resistor sensor.

21. The circuit according to claim 1, wherein said at least one power connection (20), said circuit base (2), said conductor array (8) and at least one of said at least one power lead (15) are assembled in a flat assembly (1).

22. An electrical circuit comprising:
a circuit base (2);
a conductor array (8) at least partially including a conducting layer with at least one first connecting member (11); and
at least one power connection (20) including a microbond between said at least one first connecting member and a second connecting member (11, 13) said at least one first connecting member (11) being directly supported by said circuit base (2) for electrically interconnecting with said conductor array (8), said second connecting member (13) being directly electrically connected to at least one power lead (15), said at least one first connecting member (11) including a first connecting face (12) and said second connecting member (13) including a second connecting face (14) directly connected to said first connecting face (12) via said microbond, said conductor array (8) defining a first conductive cross-section (26) including maximum and minimum first cross-sections (26), said second connecting member (13) defining a second conductive cross-section (27), wherein said second conductive cross-section (27) is larger than said first conductive cross-section (26) and wherein at said microbond, said second connecting member (13) is press-formed to a varying thickness (21, 22).

23. An electrical circuit comprising:
a circuit base (2);
a conductor array (8) at least partially including a conducting layer with at least one first connecting member (11); and
at least one power connection (20) including a microbond between said at least one first connecting member and a second connecting member (11, 13), said at least one first connecting member (11) being directly supported by said circuit base (2) for electrically interconnecting with said conductor array (8), said second connecting member (13) being directly electrically connected to at least one power lead (15), said at least one first connecting member (11) including a first connecting face (12) and said second connecting member (13) including a second connecting face (14) directly connected to said first connecting face (12) via said microbond, said conductor array (8) defining a first conductive cross-section (26) including maximum and minimum first cross-sections (26), said second connecting member (13) defining a second conductive cross-section (27), wherein said second conductive cross-section (27) is larger than said first conductive cross-section (26), wherein apart from and additional to said microbond a positional lock (30) is provided for positionally securing said at least one power lead (15) directly with said circuit base (2), said at least one power lead (15) being an external lead including a lead section remote from said second connecting member (13), said lead section freely and accessibly projecting out of said positional lock (30) and wherein said positional lock (30) includes a locking seal preventing lifting-off and longitudinal pulling motion of said second connecting member (13) by positive and frictional engagement in said at least one power lead (15) and said circuit base (2), said locking seal being longitudinally spaced from said microbond.

* * * * *

UNITED STATES PATENT AND TRADEMARK OFFICE
CERTIFICATE OF CORRECTION

PATENT NO. : 5,831,214
DATED : November 3, 1998
INVENTOR(S) : Diehlmann et al.

It is certified that error appears in the above-identified patent and that said Letters Patent is hereby corrected as shown below:

Column 6, line 30, "(33)" should be --11--.

Column 7, line 22, "Platinum" should be --platinum--.

Signed and Sealed this

Sixth Day of July, 1999

Attest:

Q. TODD DICKINSON

*Attesting Officer*     *Acting Commissioner of Patents and Trademarks*